United States Patent
Ahn et al.

(10) Patent No.: US 9,318,201 B2
(45) Date of Patent: Apr. 19, 2016

(54) SEMICONDUCTOR MEMORY DEVICE INCLUDING THREE-DIMENSIONAL ARRAY STRUCTURE

(71) Applicant: SK hynix Inc., Icheon-si Gyeonggi-do (KR)

(72) Inventors: Jung Ryul Ahn, Namyangju-si (KR); Yun Kyoung Lee, Seoul (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 14/570,535

(22) Filed: Dec. 15, 2014

(65) Prior Publication Data

US 2016/0012893 A1    Jan. 14, 2016

(30) Foreign Application Priority Data

Jul. 10, 2014    (KR) .................. 10-2014-0086793

(51) Int. Cl.
*G11C 16/04*    (2006.01)
(52) U.S. Cl.
CPC ................... *G11C 16/0483* (2013.01)
(58) Field of Classification Search
USPC ................. 365/185.17, 185.2, 210.1
See application file for complete search history.

(56) References Cited

U.S. PATENT DOCUMENTS

| 7,079,437 B2 * | 7/2006 | Hazama ............... G11C 16/10 257/E21.69 |
| 2014/0085983 A1 | 3/2014 | Hosono | |

FOREIGN PATENT DOCUMENTS

| KR | 1020120034828 A | 4/2012 |
| KR | 1020130044711 A | 5/2013 |
| KR | 1020130080205 A | 7/2013 |

* cited by examiner

Primary Examiner — Vu Le
(74) Attorney, Agent, or Firm — William Park & Associates Ltd.

(57) ABSTRACT

A semiconductor memory device may include source selection transistors coupled to a common source line, source side dummy memory cells coupled between the source selection transistors and the normal memory cells, and drain selection transistors coupled to a bit line. The semiconductor memory device may include drain side dummy memory cells coupled between the drain selection transistors and the normal memory cells. A number of the source side dummy memory cells is less than a number of the drain side dummy memory cells, and a number of the drain selection transistors may be greater than the source selection transistors.

20 Claims, 9 Drawing Sheets

FIG. 5

| ROW LINE | VOLTAGE |
|---|---|
| DSL1_1 (unselected) | Vdsl1 |
| DSL1_2 (unselected) | Vdsl2 |
| DSL2_1 (selected) | Vdsl3 |
| DSL2_2 (selected) | |
| DWL3 | Vdwl5 |
| DWL2 | Vdwl4 |
| DWL1 | Vdwl3 |
| NWLus | Vpass |
| NWLs | Vpgm |
| SWL2 | Vdwl2 |
| SWL1 | Vdwl1 |
| SSL1 | Vssl1 |
| SSL2 | Vssl2 |

SEMICONDUCTOR MEMORY DEVICE INCLUDING THREE-DIMENSIONAL ARRAY STRUCTURE

CROSS-REFERENCE TO RELATED APPLICATION

The present application claims priority to Korean patent application number 10-2014-0086793 filed on Jul. 10, 2014 in the Korean Intellectual Property Office, the entire disclosure of which is incorporated by reference herein.

BACKGROUND

1. Technical Field

Various embodiments relate generally to an electronic device, and more particularly, to a semiconductor memory device including a three-dimensional array structure.

2. Related Art

Semiconductor memory devices are embodied with semiconductors such as silicon (Si), germanium (Ge), gallium arsenide (GaAs), or indium phosphide (Inp). Semiconductor memory devices may be classified into in to two classes. One class may include volatile memory devices and the other class may include non-volatile memory devices.

Volatile memory devices lose stored data when the power is off. Examples of volatile memory devices include Static RAM (SRAM), Dynamic RAM (DRAM) and Synchronous DRAM (SDRAM). Non-volatile memory devices can retain stored data regardless of power on/off conditions. Examples of non-volatile memory include Read Only Memory (ROM), Mask ROM (MROM), Programmable ROM (PROM), Erasable Programmable ROM (EPROM), Electrically Erasable and Programmable ROM (EEPROM), flash memory, Phase-change Random Access Memory (PRAM), Magnetic RAM (MRAM), Resistive RAM (RRAM) and Ferroelectric RAM (FRAM). Flash memories may be classified into two types of memories. One type may include NOR-type memories and the other type may include NAND-type memories.

Recently, to improve the degree of integration in semiconductor memory devices, research has been conducted on semiconductor memory devices having a three-dimensional array structure.

BRIEF SUMMARY

A semiconductor memory device, in an embodiment, may include normal memory cells stacked over a substrate and may include source selection transistors coupled to a common source line. The semiconductor memory device may include source side dummy memory cells coupled between the source selection transistors and the normal memory cells, drain selection transistors coupled to a bit line, and drain side dummy memory cells coupled between the drain selection transistors and the normal memory cells. The semiconductor memory device may include a number of drain selection transistors that are greater than the source selection transistors, and a number of the source side dummy memory cells is less than a number of the drain side dummy memory cells.

In an embodiment, the number of drain selection transistors may be greater than the number of source selection transistors by a difference between the number of source side dummy memory cells and the number of drain side dummy memory cells.

In an embodiment, the drain selection transistors may include first drain selection transistors and second drain selection transistors coupled in series with each other, the first drain selection transistors may be coupled in common to a first drain selection line, and the second drain selection transistors may be coupled in common to a second drain selection line.

In an embodiment, the source selection transistors may be coupled in common to a single source selection line.

In an embodiment, the semiconductor memory device may further include a pipe transistor, wherein the source selection transistors, the source side dummy memory cells and first normal memory cells, among the normal memory cells, form a first sub-cell string, second normal memory cells, among the normal memory cells, the drain side dummy memory cells and the drain selection transistors form a second sub-cell string, and the first and second sub-cell strings are coupled through the pipe transistor.

In an embodiment, the first normal memory cells, the source side dummy memory cells and the source selection transistors may be sequentially stacked in a direction crossing the substrate. In an embodiment, the second normal memory cells, the drain side dummy memory cells and the drain selection transistors may be sequentially stacked in the direction crossing the substrate.

In an embodiment, the source selection transistors, the source side dummy memory cells, the normal memory cells, the drain side dummy memory cells and the drain selection transistors may be sequentially stacked in a direction crossing the substrate.

A semiconductor memory device according to an embodiment may include a pipe transistor, a first sub-cell string extending between the pipe transistor and a common source line and including source selection transistors coupled to the common source line and source side dummy memory cells coupled to the source selection transistors. The semiconductor memory device may include a second sub-cell string extending between the pipe transistor and a bit line and including drain selection transistors coupled to the bit line and drain side dummy memory cells coupled to the drain selection transistors. The semiconductor memory device may include a number of source side dummy memory cells that are less than a number of drain side dummy memory cells, and a number of drain selection transistors that are greater than a number of source selection transistors.

In an embodiment, the number of drain selection transistors may be greater than the number of source selection transistors by a difference between the number of source side dummy memory cells and the number of drain side dummy memory cells.

In an embodiment, a height of the first sub-cell string from the pipe transistor may be equal to a height of the second sub-cell string from the pipe transistor.

In an embodiment, the first sub-cell string may include first normal memory cells coupled in series between the source side dummy memory cells and the pipe transistor, and the second sub-cell string may include second normal memory cells coupled in series between the drain side dummy memory cells and the pipe transistor.

In an embodiment, a number of first normal memory cells may be greater than a number of second normal memory cells.

In an embodiment, the number of first normal memory cells may be greater than the number of second normal memory cells by a sum of a difference between the number of source side dummy memory cells and the number of drain side dummy memory cells and a difference between the number of source selection transistors and the number of drain selection transistors.

In an embodiment, the drain selection transistors may include first drain selection transistors and second drain selection transistors coupled in series with each other, the first drain selection transistors may be coupled in common to a first drain selection line, and the second drain selection transistors may be coupled in common to a second drain selection line.

In an embodiment, the source selection transistors may be coupled in common to a single source selection line.

In an embodiment, a semiconductor memory device may include a first sub-cell string stacked over a substrate and including a first set of normal memory cells, and a second sub-cell string stacked over the substrate and including a second set of normal memory cells. The semiconductor memory device may include drain selection transistors coupled to the second set of normal memory cells, and source selection transistors coupled to the first set of normal memory cells. The first and second sub-cell strings may be configured to reduce leakage current of the normal memory cells by including greater numbers of the drain selection transistors in the second sub-cell string than the source selection transistors in the first sub-cell string.

BRIEF DESCRIPTION OF THE DRAWINGS

FIG. 5 is a table illustrating a representation of voltages applied to row lines coupled to a selected memory block during a program operation of a semiconductor memory device.

DETAILED DESCRIPTION

Figure 1:
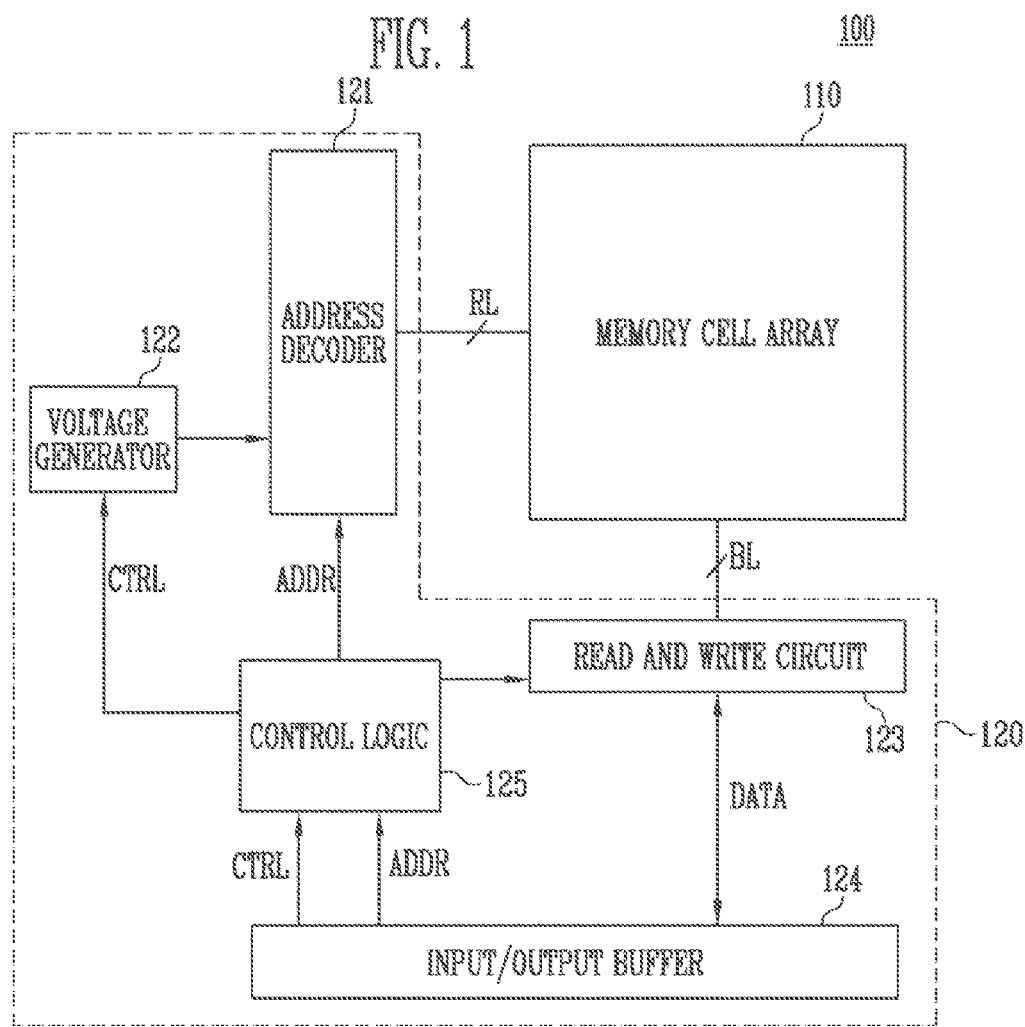
FIG. 1 is a block diagram illustrating a representation of a semiconductor memory device.

Hereinafter, various embodiments will be described in detail with reference to the accompanying drawings. The figures are provided to allow those with ordinary skill in the art to understand the scope of the embodiments. The illustrated embodiments may, however, be embodied in different forms and should not be construed as limited to the embodiments set forth. Rather, these embodiments are provided so that this disclosure will be thorough and complete. In addition, the embodiments are provided to fully convey the scope of the application to those skilled in the art.

Throughout the disclosure, reference numerals correspond directly to the like numbered parts in the various figures and embodiments. It is also noted that in this specification, "connected/coupled" refers to one component not only directly coupling another component but also indirectly coupling another component through an intermediate component. In addition, a singular form may include a plural form, and vice versa, as long as it is not specified.

Various embodiments may relate to a semiconductor memory device having an improved reliability.

FIG. 1 is a block diagram illustrating a representation of a semiconductor memory device 100.

Referring to FIG. 1, the semiconductor memory device 100 may include a memory cell array 110 and a peripheral circuit 120.

The memory cell array 110 may be coupled to an address decoder 121 through row lines RL. The memory cell array 110 may be coupled to a read and write circuit 123 through bit lines BL.

The memory cell array 110 may include a plurality of memory blocks. Each of the memory blocks may include a plurality of cell strings. Each of the cell strings may include a plurality of memory cells stacked over a substrate. According to an embodiment, the plurality of memory cells may be non-volatile memory cells. According to an embodiment, each of the plurality of memory cells may be defined as a single level cell or multi level cells. The memory cell array 110 is described in detail with reference to FIGS. 2 and 3.

The peripheral circuit 120 may include the address decoder 121, a voltage generator 122, and the read and write circuit 123. The peripheral circuit 120 may include an input/output buffer 124 and a control logic 125.

The address decoder 121 may be coupled to the memory cell array 110 through the row lines RL. The row lines RL may include drain selection lines, dummy word lines, normal word lines, source selection lines and a common source line. According to an embodiment, the row lines RL may include a pipe line.

The address decoder 121 may be configured to control the row lines RL in response to control of the control logic 125. The address decoder 121 may receive an address ADDR from the include control logic 125.

According to an embodiment, a program operation and a read operation of the semiconductor memory device 100 may be performed in page units. During the program operation and the read operation, the address ADDR may include a block address and a row address. The address decoder 121 may be configured to decode the block address, among the received address ADDR. The address decoder 121 may select one memory block in response to the decoded block address. The address decoder 121 may be configured to decode a row address, among the received address ADDR. The address decoder 121 may select one of the drain selection lines of the selected memory block in response to the decoded row address and select one of the plurality of the normal word lines of the selected memory block. As a result, normal memory cells corresponding to a single page may be selected.

According to an embodiment, during an erase operation, the address ADDR may include a block address. The address decoder 121 may decode the block address and select one memory block in response to the decoded block address. Therefore, data of the selected memory block may be erased.

According to an embodiment, the address decoder 121 may include a block decoder, a row decoder and an address buffer.

The voltage generator 122 may be controlled by the control logic 125. The voltage generator 122 may generate an internal power voltage by using an external power voltage provided to the semiconductor memory device 100. For example, the voltage generator 122 may generate the internal power voltage by regulating an external power voltage. The generated internal power voltage may be provided to the address decoder 121. The generated internal power voltage may be provided to the read and write circuit 123. The generated internal power voltage may be provided to the input/output buffer 124 and the control logic 125 and used as an operating voltage of the semiconductor memory device 100.

The voltage generator 122 may generate a plurality of voltages by using at least one of the external power voltage and the internal power voltage. According to an embodiment, the voltage generator 122 may include a plurality of pumping capacitors receiving the internal power voltage. The voltage generator 122 may generate a plurality of voltages by selectively activating the plurality of pumping capacitors in response to the control CTRL of the control logic 125. For example, the voltage generator 122 may generate various voltages to be applied to the row lines RL and provide the generated voltages to the address decoder 121.

The read and write circuit 123 may be coupled to the memory cell array 110 through the bit lines BL. The read and write circuit 123 may be controlled by the control logic 125.

During the erase operation, the read and write circuit 123 may float the bit lines BL. During the program operation, the read and write circuit 123 may transfer data DATA to be programmed from the input/output buffer 124 to the bit lines BL. The selected normal memory cells may be programmed in response to the transferred data DATA. During the read operation, the read and write circuit 123 may read the data DATA from the selected normal memory cells through the bit lines BL and output the read data DATA to the input/output buffer 124.

According to an embodiment, the read and write circuit 123 may include page buffers (or page registers) and a column selection circuit.

The control logic 125 may be coupled to the address decoder 121. The control logic 125 may be coupled to the voltage generator 122. The control logic 125 may be coupled to the read and write circuit 123. The control logic 125 may be coupled to the output buffer 124. The control logic 125 may receive a control signal CTRL and the address ADDR from the input/output buffer 124. The control logic 125 may be configured to control the general operation of the semiconductor memory device 100 in response to the control signal CTRL. The control logic 125 may transfer the address ADDR to the address decoder 121.

The input/output buffer 124 may receive the control signal CTRL and the address ADDR from an external device and transfer the control signal CTRL and the address ADDR to the control logic 125. In addition, the input/output buffer 124 may transfer the data DATA to the read and write circuit 123. The input/output buffer 124 may output the data DATA received from the read and write circuit 123 to an external device.

According to an embodiment, the semiconductor memory device 100 may be a flash memory device.

Figure 2:
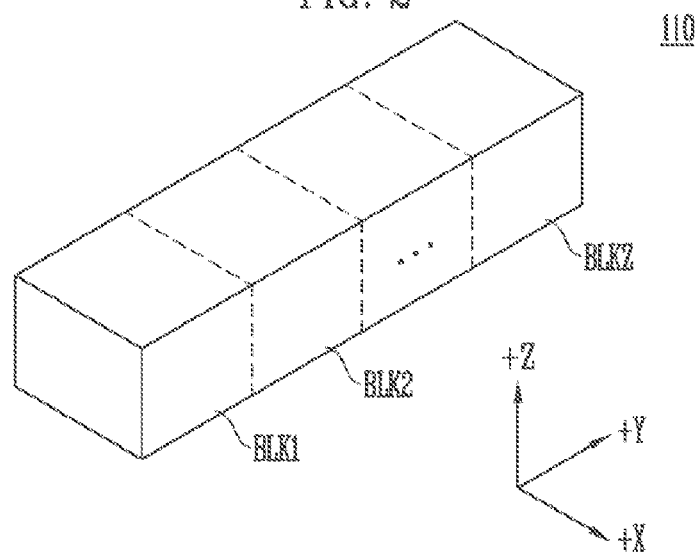
FIG. 2 is a block diagram illustrating an embodiment of a representation of a memory cell array illustrated in FIG. 1.

FIG. 2 is a block diagram illustrating a representation of an embodiment of the memory cell array 110 illustrated in FIG. 1.

Referring to FIG. 2, the memory cell array 110 may include a plurality of memory blocks BLK1 to BLKz. Each of the memory blocks may include a three-dimensional structure. Each memory block may include a plurality of memory cells stacked over the substrate. The plurality of memory cells may be substantially arranged in +X direction, +Y direction, and +Z direction. The structure of each memory block will be described in detail with reference to FIG. 3.

Figure 3:
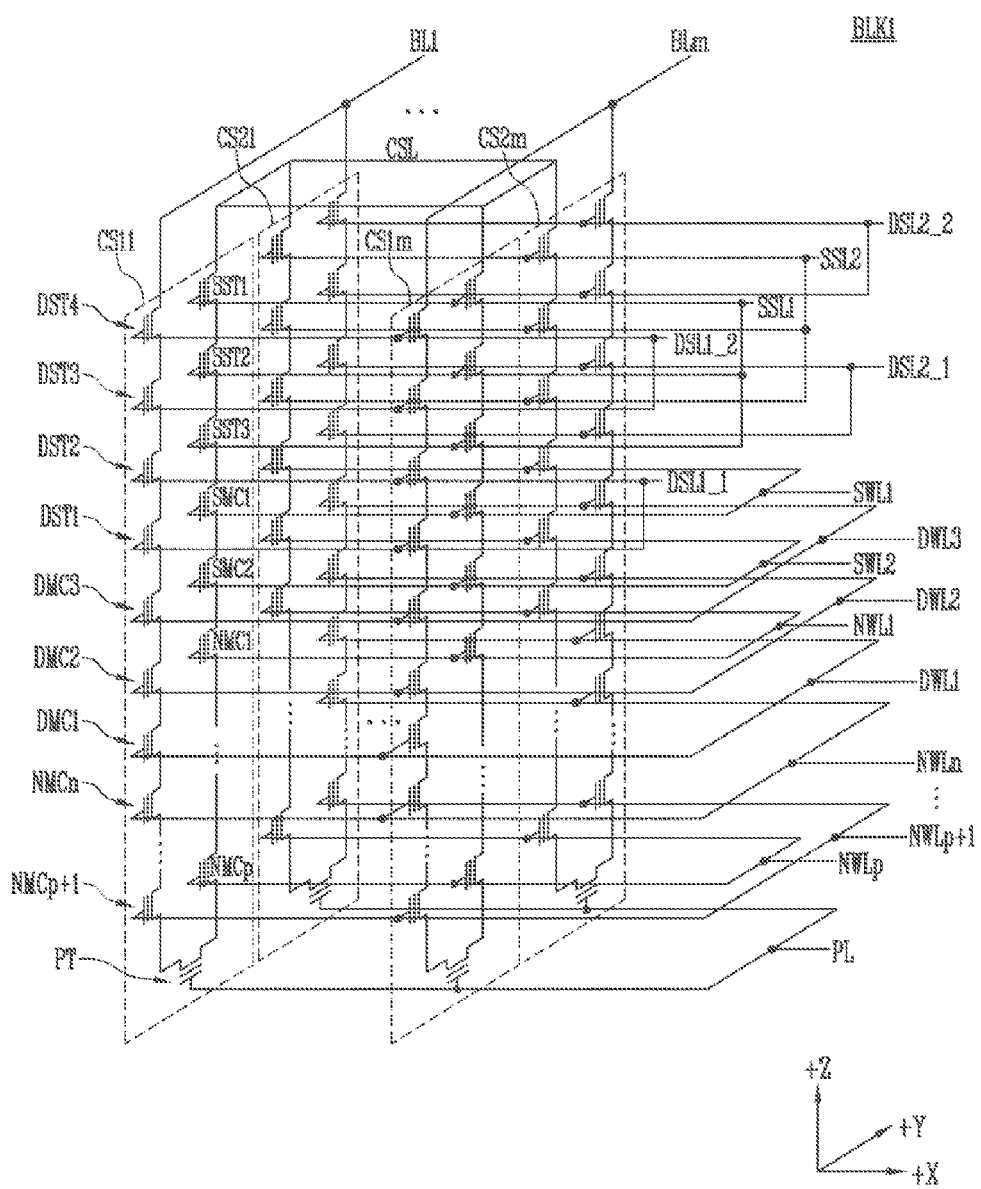
FIG. 3 is a circuit diagram illustrating a representation of one of memory blocks illustrated in FIG. 2.

FIG. 3 is a circuit diagram illustrating a representation of one (for example, BLK1) of the memory blocks BLK1 to BLKz illustrated in FIG. 2.

Referring to FIG. 3, one of the memory blocks BLK1 to BLKz or for example the first memory block BLK1 may include a plurality of cell strings CS11 to CS1$m$ and CS21 to CS2$m$. Each of the cell strings CS11 to CS1$m$ and CS21 to CS2$m$ may be formed in substantially a 'U' shape. In the first memory block BLK1, m cell strings may be arranged in a row direction (i.e., +X direction). In FIG. 3, only two cell strings arranged in a column direction are shown for illustration purposes. However, more than two cell strings may be arranged in the column direction (i.e., +Y direction).

Each of the cell strings CS11 to CS1$m$ and CS21 to CS2$m$ may include first to third source selection transistors SST1 to SST3. Each of the cell strings CS11 to CS1$m$ and CS21 to CS2$m$ may include first and second source side dummy memory cells SMC1 and SMC2. Each of the cell strings CS11 to CS1$m$ and CS21 to CS2$m$ may include first to n-th normal memory cells NMC1 to NMCn. Each of the cell strings CS11 to CS1$m$ and CS21 to CS2$m$ may include a pipe transistor PT. Each of the cell strings CS11 to CS1$m$ and CS21 to CS2$m$ may include first to third drain side dummy memory cells DMC1 to DMC3. Each of the cell strings CS11 to CS1$m$ and CS21 to CS2$m$ may include first to fourth drain selection transistors DST1 to DST4.

The selection transistors SST1 to SST3 and DST1 to DST4, the dummy memory cells SMC1, SMC2, and DMC1 to DMC3 and the normal memory cells NMC1 to NMCn may have similar structures or substantially similar structures. According to an embodiment, each of the selection transistors SST1 to SST3 and DST1 to DST4, the dummy memory cells SMC1, SMC2, and DMC1 to DMC3 and the normal memory cells NMC1 to NMCn may include a channel layer, a tunneling insulating layer, a charge storage layer and a blocking insulating layer.

The first to third source selection transistors SST1 to SST3 of each of the cell strings may be coupled in series between the common source line CSL and the source side dummy memory cells SMC1 and SMC2. Sources of the first source selection transistors SST1 of the cell strings CS11 to CS1$m$ and CS21 to CS2$m$ may be coupled in common to the common source line CSL.

According to an embodiment, source selection transistors of cell strings (for example, CS11 to CS1$m$) arranged in the same row (+X direction) may be coupled to a source selection line (for example, SSL1) extending in the row direction. In addition, the first to third source selection transistors SST1 to SST3 of each cell string may be coupled in common to a single source selection line. Source selection transistors of cell strings (for example, CS11 and CS21) arranged in different rows may be coupled to different source selection lines (for example, SSL1 and SSL2).

The source side dummy memory cells SMC1 and SMC2 of each cell string may be coupled between the source selection transistors SST1 to SST3 and the normal memory cells NMC1 to NMCp. Gates of source side dummy memory cells having substantially the same height in the first memory block BLK1 may be coupled to a single source side dummy word line. A gate of the first source side dummy memory cell SMC1 may be coupled to a first source side dummy word line SWL1.

A gate of the second source side dummy memory cell SMC2 may be coupled to a second source side dummy word line SWL2.

The first to n-th normal memory cells NMC1 to NMCn of each cell string may be coupled between the source side dummy memory cells SMC1 and SMC2 and the drain side dummy memory cells DMC1 to DMC3.

The first to n-th normal memory cells NMC1 to NMCn may be divided into the first to p-th normal memory cells NMC1 to NMCp and p+1-th to n-th normal memory cells NMCp+1 to NMCn. The first to p-th normal memory cells NMC1 to NMCp and the p+1-th to n-th normal memory cells NMCp+1 to NMCn may be coupled through the pipe transistor PT.

The first to p-th normal memory cells NMC1 to NMCp may be sequentially arranged in a reverse direction to the +Z direction and be coupled in series between the source side dummy memory cells SMC1 and SMC2 and the pipe transistor PT. The p+1-th to n-th normal memory cells NMCp+1 to NMCn may be sequentially arranged in the +Z direction and be coupled in series between the pipe transistor PT and the drain side dummy memory cells DMC1 to DMC3. Gates of the first to n-th normal memory cells NMC1 to NMCn may be coupled to first to n-th normal word lines NWL1 to NWLn, respectively. Gates of the NMCp+1 to NMCp may be coupled to p+1 to p normal word lines NMCp+1 to NMCp, respectively.

Data may be stored in the first to n-th normal memory cells NMC1 to NMCn through first to m-th bit lines BL1 to BLm, respectively. The data stored in the first to n-th normal memory cells NMC1 to NMCn may be read through the first to m-th bit lines BL1 to BLm, respectively.

Gates of the pipe transistor PT of each cell string may be coupled to a pipe line PL.

The drain side dummy memory cells DMC1 to DMC3 of each cell string may be coupled between the drain selection transistors DST1 to DST4 and the normal memory cells NMCp+1 to NMCn. In the first memory block BLK1, gates of drain side dummy memory cells having substantially the same height may be coupled to a single drain side dummy word line. Gates of the first to third drain side dummy memory cells DMC1 to DMC3 of each cell string may be coupled to the first to third drain side dummy word lines DWL1 to DWL3, respectively.

The data may not be stored in the dummy memory cells SMC1, SMC2, and DMC1 to DMC3.

The first to fourth drain selection transistors DST1 to DST4 of each cell string may be coupled in series between the corresponding bit line and the drain side dummy memory cells DMC1 to DMC3. According to an embodiment, as illustrated in FIG. 3, the first and second drain selection transistors DST1 and DST2 of each cell string may be coupled to a single drain selection line, and the third and fourth drain selection transistors DST3 and DST4 of each cell string may be coupled to another drain selection line.

Cell strings arranged in the row direction may be coupled to drain selection lines DSL1_1, DSL1_2, DSL2_1, and DS2_2 extending in the row direction. The cell strings CS11 to CS1m in a first row may be coupled to the first drain selection lines DSL1_1 and DSL1_2. The first and second drain selection transistors DST1 and DST2 of the cell strings CS11 to CS1m in the first row may be coupled to the drain selection line DSL1_1. The third and fourth drain selection transistors DST3 and DST4 of the cell strings CS11 to CS1m in the first row may be coupled to the drain selection line DSL1_2. The cell strings CS21 to CS2m in a second row may be coupled to the second drain selection lines DSL2_1 and DSL2_2. The first and second drain selection transistors DST1 and DST2 of the cell strings CS21 to CS2m in the second row may be coupled to the drain selection line DSL2_1. The third and fourth drain selection transistors DST3 and DST4 of the cell strings CS21 to CS2m in the second row may be coupled to the drain selection line DSL2_2.

Cell strings arranged in the column direction (+Y direction) may be coupled to a bit line extending in the column direction. The first to m-th cell strings CS11 to CS1m or CS21 to CS2m arranged in the row direction may be coupled to the first to m-th bit lines BL1 to BLm, respectively.

According to an embodiment, even bit lines and odd bit lines may be provided instead of the first to m-th bit lines BL1 to BLm. Even cell strings, among the cell strings CS11 to CS1m or CS21 to CS2m arranged in the row direction, may be coupled to even bit lines, respectively. Odd cell strings, among the cell strings CS11 to CS1m or CS21 to CS2m arranged in the row direction, may be coupled to odd bit lines, respectively.

As illustrated in FIG. 3, in each cell string, the normal memory cells NMC1 to NMCp, the dummy memory cells SMC1 and SMC2, and the source selection transistors SST1 to SST3 may be sequentially stacked in a direction crossing the substrate, i.e., +Z direction. In each cell string, the normal memory cells NMCp+1 to NMCn, the drain dummy memory cells DMC1 to DMC3, and the drain selection transistors SST1 to SST4 may be sequentially stacked in the +Z direction.

According to an embodiment, the number of source side dummy memory cells SMC1 and SMC2 may be smaller than the number of drain side dummy memory cells DMC1 to DMC3, and the number of drain selection transistors DST1 to DST4 may be greater than the number of source selection transistors SST1 to SST3.

Figure 4:
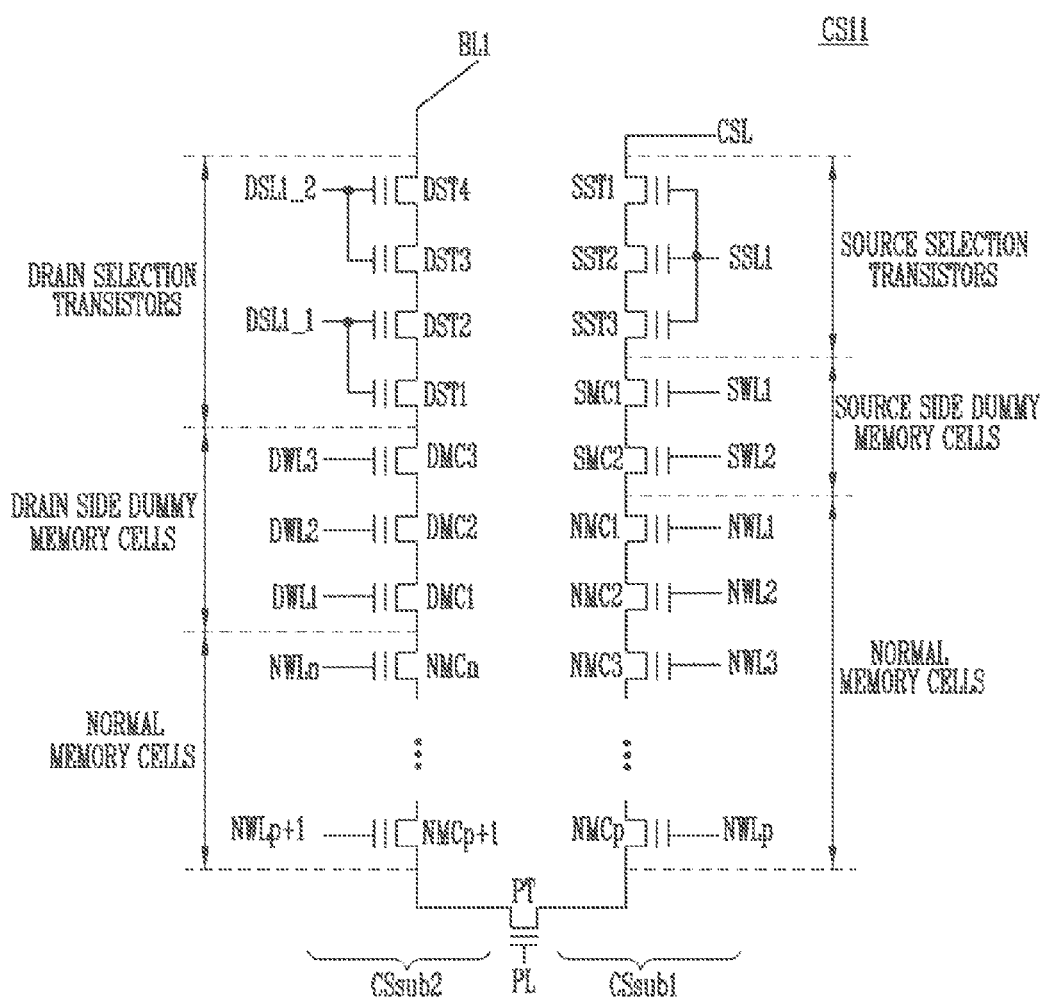
FIG. 4 is a diagram illustrating a representation of one of cell strings illustrated in FIG. 3.

FIG. 4 is a diagram illustrating a representation of one (for example, CS11) of the cell strings CS11 to CS1m and CS21 to CS2m illustrated in FIG. 3.

Referring to FIGS. 3 and 4, the cell string CS11 may include the source selection transistors SST1 to SST3, the source side dummy memory cells SMC1 and SMC2, and the first to n-th normal memory cells NMC1 to NMCn. The cell string CS11 may include the pipe transistor PT, the drain side dummy memory cells DMC1 to DMC3, and the drain selection transistors DST1 to DST4.

The cell string CS11 may include a first sub-cell string CSsub1. The cell string CS11 may include a second sub-cell string CSsub2. The first sub-cell string CSsub1 may include the source selection transistors SST1 to SST3. The first sub-cell string CSsub1 may include the source side dummy memory cells SMC1 and SMC2 and the first to p-th normal memory cells NMC1 to NMCp (i.e. a first set of normal memory cells). The second sub-cell string CSsub2 may include the p+1-th to n-th normal memory cells NMCp+1 to NMCn (i.e., a second set of normal memory cells). The second sub-cell string CSsub2 may include the drain side dummy memory cells DMC1 to DMC3 and the drain selection transistors DST1 to DST4.

The first sub-cell string CSsub1 and the second sub-cell string CSsub2 may be coupled through the pipe transistor PT.

According to an embodiment, the number of drain selection transistors DST1 to DST4 may be greater than the source selection transistors SST1 to SST3 by the difference between the number of source side dummy memory cells SMC1 and SMC2 and the number of drain side dummy memory cells DMC1 to DMC3. For example, in FIGS. 3 and 4, a value obtained by subtracting the number of source side dummy memory cells SMC1 and SMC2 from the number of drain side dummy memory cells DMC1 to DMC3 is 1. For example, the number of drain selection transistors DST1 to DST4 may be one more than the number of source selection transistors SST1 to SST3.

The number of normal memory cells of the first sub-cell string CSsub1 may be greater than the number of normal memory cells of the second sub-cell string CSsub2. The number of first to p-th normal memory cells NMC1 to NMCp may be greater than the number of p+1-th to n-th normal memory cells NMCp+1 to NMCn. More specifically, the number of first to p-th normal memory cells NMC1 to NMCp may be greater than the number of p+1-th to n-th normal memory cells NMCp+1 to NMCn by a value obtained by adding the value obtained by subtracting the number of source side dummy memory cells SMC1 and SMC2 from the number of drain side dummy memory cells DMC1 to DMC3 and a value obtained by subtracting the number of source selection transistors SST1 to SST3 from the number of drain selection transistors DST1 to DST4. The first normal memory cell NMC1 may be located at substantially the same height as the second drain side dummy memory cell DMC2, and the second normal memory cell NMC2 may be located at substantially the same height as the first drain side dummy memory cell DMC1. A height of the first sub-cell string CSsub1 from the pipe transistor PT may be substantially the same as a height of the second sub-cell string CSsub2 from the pipe transistor PT.

Therefore, by providing more drain selection transistors DST1 to DST4, leakage of current through the drain selection transistors DST1 to DST4 may be prevented, and the number of normal memory cells NMC1 to NMCn may be maintained.

FIG. 5 is a table illustrating a representation of voltages applied to the row lines coupled to the selected memory block during a program operation of the semiconductor memory device 100. Hereinafter, for convenience of explanation, it is assumed that a program operation is performed on one page of the cell strings CS21 to CS2m in the second row.

The first drain selection lines DSL1_1 and DSL1_2 may not be selected, and the second drain selection lines DSL2_1 and DS2_2 may be selected. Referring to FIGS. 3 to 5, first and second drain selection line voltages Vdsl1 and Vdsl2 may be applied to the first drain selection lines DSL1_1 and DSL1_2 to electrically separate the cell strings CS11 to CS1m in the first row from the bit lines BL1 to BLm, respectively.

Various voltages for electrically separating the cell strings CS11 to CS1m in the first row from the bit lines BL1 to BLm may be provided as the first and second drain selection line voltages Vdsl1 and Vdsl2. The first and second drain selection line voltages Vdsl1 and Vdsl2 may be low voltages. For example, the first and second drain selection line voltages Vdsl1 and Vdsl2 may be lower than threshold voltages of the first to fourth drain selection transistors DST1 to DST4. In an embodiment, the first and second drain selection line voltages Vdsl1 and Vdsl2 may gradually increase. For example, the first drain selection line voltage Vdsl1 may be less than the second drain selection line voltage Vdsl2. In an embodiment, the first and second drain selection line voltages Vdsl1 and Vdsl2 may be equal to each other. By providing more drain selection transistors DST1 to DST4, current flowing through the drain selection transistors DST1 to DST4 from the unselected cell strings CS11 to CS1m may be reduced.

A third drain selection line voltage Vdsl3 may be applied to the second drain selection lines DSL2_1 and DSL2_2 to electrically connect the cell strings CS21 to CS2m in the second row to the bit lines BL1 to BLm. For example, the third drain selection line voltage Vdsl3 may be higher than the threshold voltages of the first to fourth drain selection transistors DST1 to DST4.

Therefore, the cell strings CS11 to CS1m in the first row may be electrically separated from the bit lines BL1 to BLm, respectively, and connected to the cell strings CS21 to CS2m in the second row to the bit lines BL1 to BLm, respectively.

The first to third drain side dummy word lines DWL1 to DWL3 may be provided with third to fifth dummy word line voltages Vdwl3 to Vdwl5, respectively. According to an embodiment, the third to fifth dummy word line voltages Vdwl3 to Vdwl5 may gradually decrease. For example, the third dummy word line voltage Vdwl3 may be greater than the fourth dummy word line voltage Vdwl4 and the fourth dummy word line voltage Vdwl4 may be greater than the fifth dummy word line voltage Vdwl5. According to an embodiment, the third to fifth dummy word line voltages Vdwl3 to Vdwl5 may be equal to each other.

A pass voltage Vpass may be applied to an unselected normal word line NWLus, among the normal word lines NWL1 to NWLn. A program voltage Vpgm may be applied to a selected normal word line NWLs, among the normal word lines NWL1 to NWLn.

Since the cell strings CS11 to CS1m in the first row are electrically separated from the bit lines BL1 to BLm and the common source line CSL, a potential of channel layers of the cell strings CS11 to CS1m in the first row may be increased in response to the pass voltage Vpass and the program voltage Vpgm.

The cell strings CS21 to CS2m in the second row may be electrically connected to the bit lines BL1 to BLm, respectively. For example, a reference voltage or a power voltage may be transferred through the bit lines BL1 to BLm in response to the data DATA to be programmed, as illustrated in FIG. 1. When the reference voltage is applied to the bit line, the reference voltage may be transferred to a channel formed in a channel layer of the corresponding cell string by the pass voltage Vpass and the program voltage Vpgm. Threshold voltages of memory cells of the selected normal word line NWLs may be increased based on the difference between the reference voltage and the program voltage Vpgm. The difference between the reference voltage and the pass voltage Vpass may not be high enough to increase the threshold voltages of the memory cells. When the power voltage is applied to the bit line, the corresponding drain selection transistors DST1 to DST4 may be turned off by the power voltage and the third drain selection line voltage Vdsl3 applied to the second drain selection lines DSL2_1 and DSL2_2. The corresponding cell string may be electrically separated from the bit line and the common source line CSL, and a potential of the channel layer of the corresponding cell string may be increased in response to the pass voltage Vpass and the program voltage Vpgm.

The first and second source side dummy word lines SWL1 and SWL2 may be provided with the first and second dummy word line voltages Vdwl1 and Vdwl2, respectively. According to an embodiment, the first and second dummy word line voltages Vdwl1 and Vdwl2 may gradually increase. For example, the first dummy word line voltage Vdwl1 may be less than the second dummy word line voltage Vdwl2. According to an embodiment, the first and second dummy word line voltages Vdwl1 and Vdwl2 may be equal to each other.

First and second source selection line voltages Vssl1 and Vssl2 may be applied to first and second source selection lines SSL1 and SSL2, respectively. For example, the first source selection line voltage Vssl1 may turn off the source selection transistors SST1 to SST3 to electrically separate the cell strings CS11 to CS1m in the first row from the common source line CSL. As a result, the cell strings CS11 to CS1m in the first row may be electrically separated from the bit lines BL1 to BLm and the common source line CSL during the program operation. For example, the second source selection line voltage Vssl2 may be applied to turn off the source selection transistors SST1 to SST3 so that the cell strings CS21 to CS2m in the second row may be electrically separated from the common source line CSL. During the program operation, the cell strings CS21 to CS2m in the second row may be electrically connected to the bit lines BL1 to BLm and separated from the common source line CSL.

Figure 6:
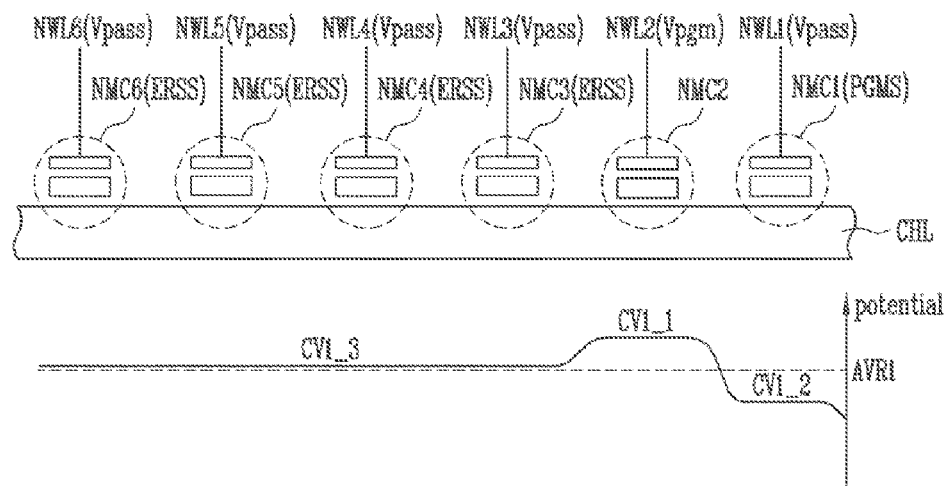
FIG. 6 is a diagram illustrating a representation of normal memory cells adjacent to source side dummy memory cells SMC1 and SMC2 of an unselected cell string and a potential of a channel layer thereof during a program operation.

FIG. 6 is a diagram illustrating a representation of normal memory cells adjacent to the source side dummy memory cells SMC1 and SMC2 of an unselected cell string and a potential of a channel layer thereof during a program operation. Referring to FIG. 6, it is assumed that a second normal word line NWL2 is selected and other word lines NWL1 and NWL3 to NWLn are not selected.

Referring to FIGS. 3 and 6, program operations may be sequentially performed on the first to n-th normal word lines NWL1 to NWLn. For example, normal memory cells (NMCp of the cell strings CS11 to CS1m and CS21 to CS2m) of a p-th normal word line NWLp (where p is greater than or equal to 1 and less than or equal to n), and normal memory cells (NMCp+1 of the memory strings CS11 to CS1m and CS21 to CS2m) of a subsequent normal word line NWLp+1 may be programmed.

Therefore, when the program operation is performed on the second normal word line NWL2, the first normal memory cell NMC1 may have a program state PGMS or an erase state ERSS. For convenience of explanation, it is assumed that the first normal memory cell NMC1 includes the program state PGMS. For convenience of explanation, it is assumed that the third to sixth normal memory cells NMC3 to NMC6 may include the erase state ERSS since the program operation is not yet performed thereon.

The program voltage Vpgm may be applied to the second normal word line NWL2. A voltage of a channel layer CHL of the second normal memory cell NMC2 may be boosted to a channel voltage CV1_1 having a relatively high level in response to the program voltage Vpgm.

The pass voltage Vpass may be applied to the other normal word lines NWL1 and NWL3 to NWL6. A voltage of the channel layer CHL of the first normal memory cell NMC1 may be boosted to a channel voltage CV1_2 corresponding to a value obtained by subtracting a threshold voltage of the first normal memory cell NMC1 from the pass voltage Vpass. Since the first normal memory cell NMC1 has the program state PGMS, the threshold voltage thereof may be a positive voltage.

The channel layer CHL of each of the third to sixth normal memory cells NMC3 to NMC6 may be boosted to a channel voltage CV1_3 corresponding to a value obtained by subtracting a threshold voltage of the corresponding normal memory cell from the pass voltage Vpass. Since the third to sixth normal memory cells NMC3 to NMC6 have the erase state ERSS, threshold voltages thereof may be negative voltages. Therefore, the channel voltage CV1_3 formed in the third to sixth normal memory cells NMC3 to NMC6 may be greater than the channel voltage CV1_2 formed in the first normal memory cell NMC1.

Based on the channel voltages CV1_1 to CV1_3A, a mean potential of the channel layer CHL of the normal memory cells NMC1 to NMC6 adjacent to the source side dummy memory cells SMC1 and SMC2 may be a first value AVR1.

Figure 7:
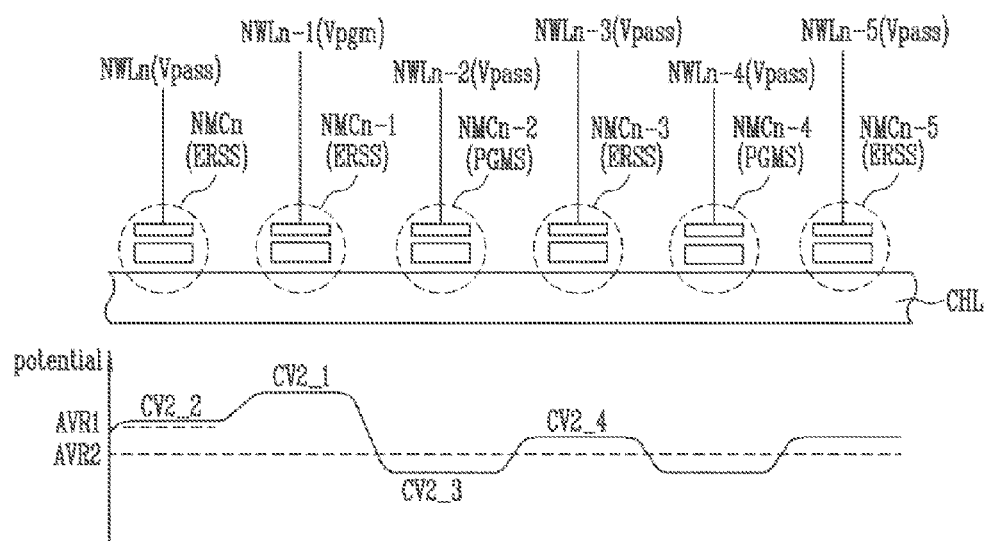
FIG. 7 is a diagram illustrating a representation of normal memory cells adjacent to drain side dummy word lines DWL1 to DWL3 and a potential of a channel layer thereof during a program operation.

FIG. 7 is a diagram illustrating a representation of normal memory cells adjacent to the drain side dummy word lines DWL1 to DWL3 of an unselected cell string and a potential of a channel layer thereof during a program operation. Referring to FIG. 7, it is assumed that an n−1-th normal word line NWLn−1 is selected and the other word lines NWLn and NWLn−2 to NWL1 are not selected.

Referring to FIGS. 3 and 7, program operations may be sequentially performed on the first to n-th normal word lines NWL1 to NWLn. Therefore, when the program operation is performed on the n−1-th normal word line NWLn−1, each of n−5-th to n−2-th normal memory cells NMCn−5 to NMCn−2 may include the program state PGMS or the erase state ERSS. Hereinafter, for convenience of explanation, it is assumed that the n−5-th and n−3-th normal memory cells NMCn−5 and NMCn−3 have the erase state ERSS. Hereinafter, for convenience of explanation, it is assumed that the n−4-th and n−2-th normal memory cells NMCn−4 and NMCn−2 have the program state PGMS. Since the n-th normal memory cell NMCn is not programmed yet, the n-th normal memory cell NMCn may include the erase state ERSS.

The program voltage Vpgm may be applied to an n−1-th normal memory cell NMCn−1. The channel layer CHL of the n−1-th normal memory cell NMCn−1 may be boosted to a channel voltage VC2_1 in response to the program voltage Vpgm having a high level.

The other normal word lines NWLn−5 to NWLn−2 and NWLn may receive the pass voltage Vpass. The channel layer CHL of the n-th normal memory cell NMCn may be boosted to a channel voltage CV2_2 corresponding to a value obtained by subtracting a threshold voltage of the n-th normal memory cell NMCn from the pass voltage Vpass. Since the n-th normal memory cell NMCn has the erase state ERSS, the threshold voltage thereof may be a negative voltage.

The channel layer CHL of each of the n−5-th to n−2-th normal memory cells NMCn−5 to NMCn−2 may be boosted to a channel voltage lower or higher than a value obtained by subtracting a threshold voltage of the corresponding normal memory cell from the pass voltage Vpass.

A voltage of a channel layer of each normal memory cell may be lower or higher than a threshold voltage of the corresponding normal memory cell from the pass voltage Vpass due to a voltage of the channel layer of a neighboring normal memory cell. For example, a voltage of the channel layer CHL of the n−4-th and n−2-th normal memory cells NMCn−4 and NMCn−2 having the program state PGMS may be increased due to the voltage of the channel layer CHL of the n−5-th and n−3-th normal memory cells NMCn−5 and NMCn−3 having the erase state ERSS. A channel voltage CV2_3 higher than the value obtained by subtracting the threshold voltage of the corresponding normal memory cell from the pass voltage Vpass may be formed in the channel layer CHL of each of the n−4-th and n−2-th normal memory cells NMCn−4 and NMCn−2. The voltage of the channel layer CHL of the n−5-th and n−3-th normal memory cells NMCn−5 and NMCn−3 having the erase state ERSS may be decreased due to the voltage of the channel layer CHL of the n−4-th and n−2-th normal memory cells NMCn−4 and NMCn−2. A channel voltage CV2_4 lower than the value obtained by subtracting the threshold voltage of the corresponding normal memory cell from the pass voltage Vpass may be formed in the channel layer CHL of each of the n−5-th and n−3-th normal memory cells NMCn−5 and NMCn−3. The channel voltage CV2_4 may be greater than the channel voltage CV2_3.

A voltage corresponding to a value obtained by subtracting an average of threshold voltages of the n−5-th to n−2-th normal memory cells NMCn−5 to NMCn−2 from the pass voltage Vpass may be formed in the channel layer of the n−5-th to n−2-th normal memory cells NMCn−5 to NMCn−2. Since the data is already stored in the n−5-th to n−2-th normal memory cells NMCn−5 to NMCn−2, the average of the threshold voltages of the n−5-th to n−2-th normal memory cells NMCn−5 to NMCn−2 may be greater than the erase state ERSS. Therefore, a channel voltage lower than the threshold voltages of the third to sixth normal memory cells NMC3 to NMC6, illustrated in FIG. 6, may be formed in the channel layer CHL of the n−5-th to n−2-th normal memory cells NMCn−5 to NMCn−2.

In addition, on the basis of the channel voltages CV2_1 to CV2_4, a mean potential of the channel layer CHL of the normal memory cells NMCn−5 to NMCn adjacent to the drain side dummy memory cells DMC1 to DMC3 may be a second value AVR2. The second value AVR2 may be lower than the first value AVR1 described above with reference to FIG. 6.

It may be assumed that current unintentionally leaks from the cell string through the drain side dummy memory cells DMC1 to DMC3 and the drain selection transistors DST1 to DST4. The mean potential of the channel layer CHL of the n−5-th to n−th normal memory cells NMCn−5 to NMCn will be further reduced. In other words, the second value AVR2 lower than the first value AVR1 may be further reduced by a leakage current. Therefore, the n−5-th to n−th normal memory cells NMCn−5 to NMCn may be inadvertently programmed according to the difference between a channel potential and the voltage applied to the normal word line.

In other words, as compared when the normal word line adjacent to the source side dummy word lines SWL1 and SWL2 is selected, the memory cells may be more susceptible to disturbance when the normal word line adjacent to the drain side dummy word lines DWL1 to DWL3 is selected.

According to an embodiment, more drain selection transistors DST1 to DST4 than the source selection transistors SST1 to SST3 may be provided. In addition, the number of source side dummy memory cells SMC1 and SMC2 may be less than the number of drain side dummy memory cells DMC1 to DMC3. In addition, the number of first to p-th normal memory cells NMC1 to NMCp may be greater than the number of p+1-th to n-th normal memory cells NMCp+1 to NMCn by a value obtained by adding a value obtained by subtracting the number of source side dummy memory cells SMC1 and SMC2 from the number of drain side dummy memory cells DMC1 to DMC3 and a value obtained by subtracting the number of source selection transistors SST1 to SST3 from the number of drain selection transistors DST1 to DST4.

Therefore, the first and second sub-cell strings CSsub1 and CSsub2 (see FIG. 4) having substantially the same height may be provided, and more drain selection transistors DST1 to DST4 may be provided, so that a leakage current may be reduced. Therefore, when the program operation is performed on the normal word line adjacent to the drain side dummy word lines DWL1 to DWL3, the data stored in the normal memory cells NMC1 to NMCn may not be damaged.

Figure 8:
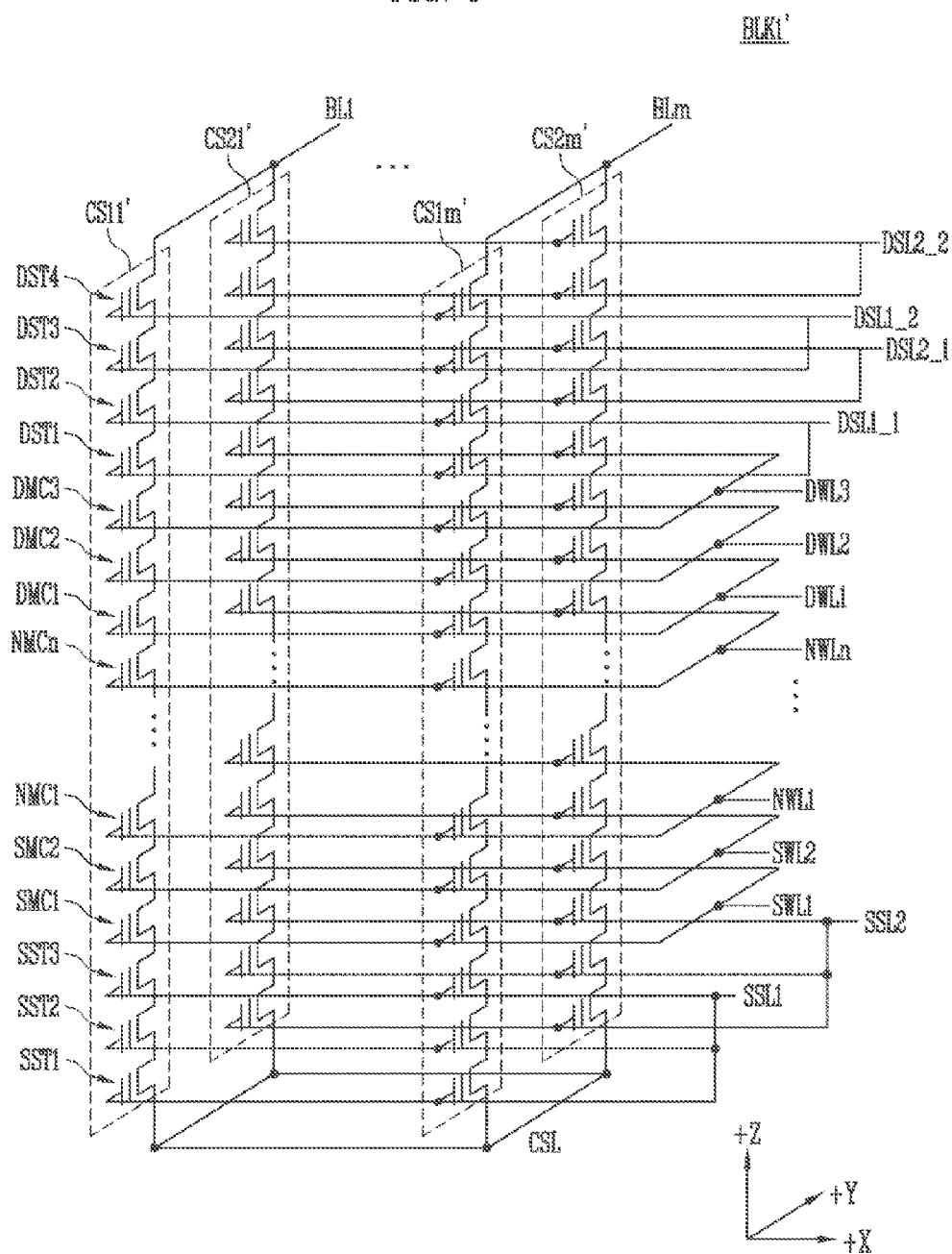
FIG. 8 is a circuit diagram illustrating an embodiment of a representation of one of the memory blocks illustrated in FIG. 2.

FIG. 8 is a circuit diagram illustrating an embodiment of a representation of (BLK1') of one (BLK1) of the memory blocks BLK1 to BLKz illustrated in FIG. 2.

Referring to FIG. 8, a first memory block BLK1' may include a plurality of cell strings CS11' to CS1m' and CS21' to CS2m'. Each of the cell strings CS11' to CS1m' and CS21' to CS2m' may extend in substantially the +Z direction. Each of the cell strings CS11' to CS1m' and CS21' to CS2m' may include first to third source selection transistors SST1 to SST3, first and second source side dummy memory cells SMC1 and SMC2, first to n-th normal memory cells NMC1 to NMCn, first to third drain side dummy memory cells DMC1 to DMC3, first to fourth drain selection transistors DST1 to DST4 stacked over a substrate (not illustrated) under the memory block BLK1'.

The first to third source selection transistors SST1 to SST3 of each cell string may be coupled in series between the common source line CSL and the source side dummy memory cells SMC1 and SMC2. Sources of the first source selection transistors SST1 of the respective cell strings may be coupled in common to the common source line CSL.

According to an embodiment, source selection transistors of cell strings (for example, CS11' to CS1m') arranged in the same row (+X direction) may be coupled to the same source selection line (for example, SSL1). Source selection transistors of cell strings (for example, CS11' and CS21') arranged in different row directions may be coupled to different source selection lines (for example, SSL1 and SSL2).

In an example, source selection transistors having substantially the same height in the first memory block BLK1' may be coupled to a single source selection line. In an example, all source selection transistors of the first memory block BLK1' may be coupled to a single source selection line. In addition to these examples, the source selection transistors SST1 to SST3 may be coupled in various other manners.

The first and second source side dummy memory cells SMC1 and SMC2 of each cell string may be coupled in series between the source selection transistors SST1 to SST3 and the normal memory cells NMC1 to NMCn. Source side dummy memory cells having substantially the same height may be coupled to the same source side dummy word line. Gates of the first and second dummy memory cells SMC1 and SMC2 may be coupled to the first and second source side dummy word lines SWL1 and SWL2, respectively.

The first to n-th normal memory cells NMC1 to NMCn of each cell string may be coupled in series between the source side dummy memory cells SMC1 and SMC2 and the drain side dummy memory cells DMC1 to DMC3. Normal memory cells having substantially the same height may be coupled to the same normal word line. The first to n-th normal memory cells NMC1 to NMCn may be coupled to the first to n-th normal word lines NWL1 to NWLn, respectively.

The first to third drain side dummy memory cells DMC1 to DMC3 of each cell string may be coupled in series between the drain selection transistors DST1 to DST4 and the normal memory cells NMC1 to NMCn. The first to third drain side dummy memory cells DMC1 to DMC3 may be coupled to the first to third drain side dummy word lines DWL1 to DWL3, respectively.

Each of the cell strings may include four drain selection transistors DST1 to DST4. The first to fourth drain selection transistors DST1 to DST4 of each cell string may be coupled between a corresponding bit line and the drain side dummy memory cells DMC1 to DMC3.

Cell strings arranged in the row direction may be coupled to the drain selection lines DSL1_1, DSL1_2, DSL2_1, and DS2_2 extending in the row direction. The first and second drain selection transistors DST1 and DST2 of the cell strings CS11' to CS1m' in the first row may be coupled to the drain selection line DSL1_1. The third and fourth drain selection transistors DST3 and DST4 of the cell strings CS11' to CS1m' in the first row may be coupled to the drain selection line DSL1_2. The first and second drain selection transistors DST1 and DST2 of the cell strings CS21' to CS2m' in the second row may be coupled to the drain selection line DSL2_1. The third and fourth drain selection transistors DST3 and DST4 of the cell strings CS21' to CS2m' in the second row may be coupled to the drain selection line DSL2_2.

As a result, the memory block BLK1', illustrated in FIG. 4, may have a similar equivalent circuit to the memory block BLK1, illustrated in FIG. 3, except that the pipe transistor PT is not formed in each cell string.

Figure 9:
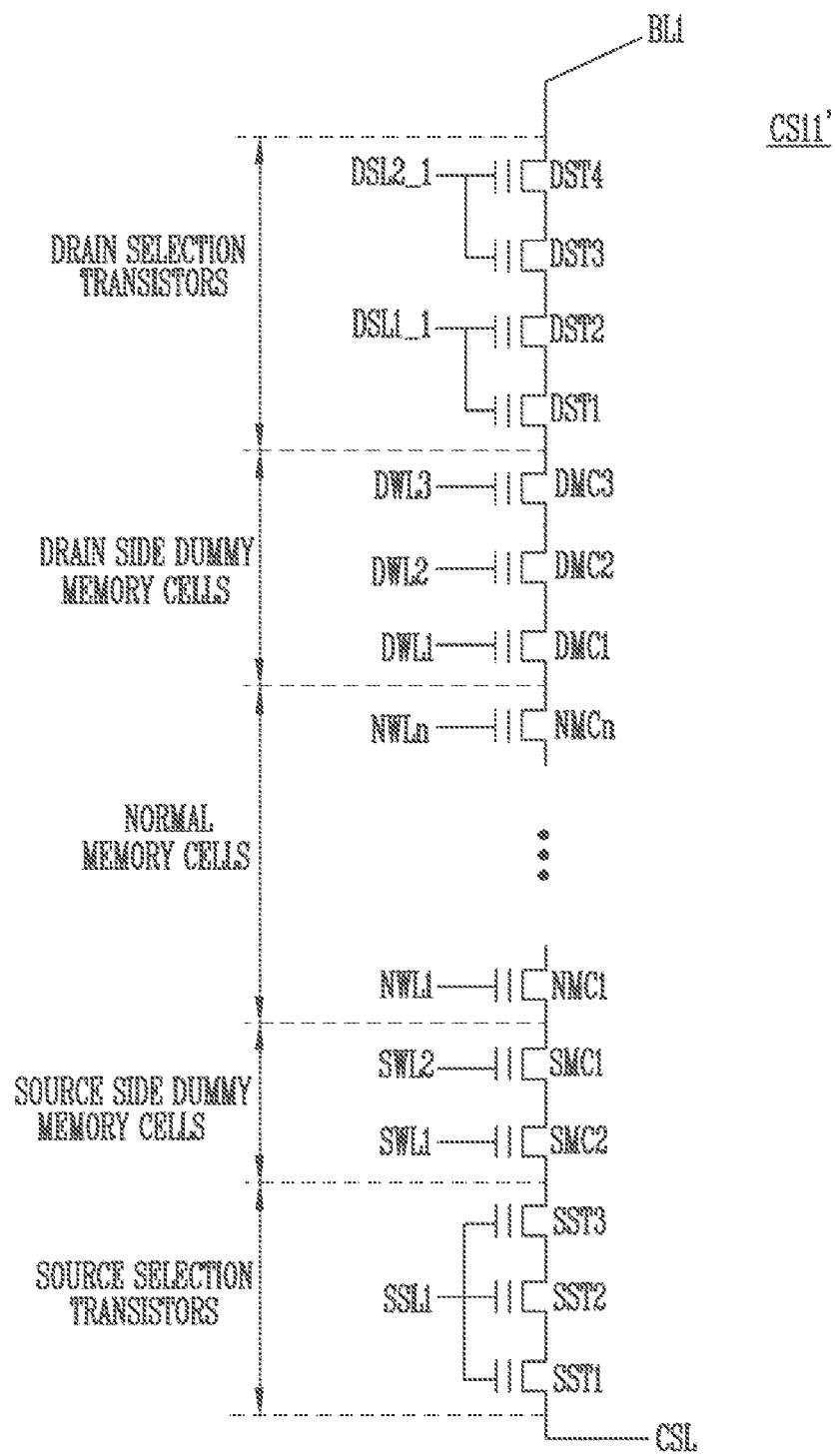
FIG. 9 is a diagram illustrating a representation of one of the cell strings illustrated in FIG. 8.

FIG. 9 is a diagram illustrating a representation of one (CS11') of the cell strings CS11' to CS1m' and CS21' to CS2m' as illustrated in FIG. 8.

The technical idea of the present application is also applicable to the structure in which the source selection transistors SST1 to SST3, the source side dummy memory cells SMC1 and SMC2, the normal memory cells NMC1 to NMCn, the drain side dummy memory cells DMC1 to DMC3, and the drain selection transistors DST1 to DST4 are sequentially stacked over the substrate (not illustrated) under the memory block BLK1'.

Referring to FIGS. 8 and 9, the number of source side dummy memory cells SMC1 and SMC2 may be less than the number of drain side dummy memory cells DMC1 to DMC3. The number of drain selection transistors DST1 to DST4 may be greater than the number of source selection transistors SST1 to SST3.

According to an embodiment, the number of drain selection transistors DST1 to DST4 may be greater than the number of source selection transistors SST1 to SST3 by the value obtained by subtracting the number of source side dummy memory cells SMC1 and SMC2 from the number of drain side dummy memory cells DMC1 to DMC3.

Therefore, by providing more drain selection transistors DST1 to DST4, current leakage through the drain selection transistors DST1 to DST4 may be prevented, and the number of normal memory cells NMC1 to NMCn may be maintained.

Figure 10:
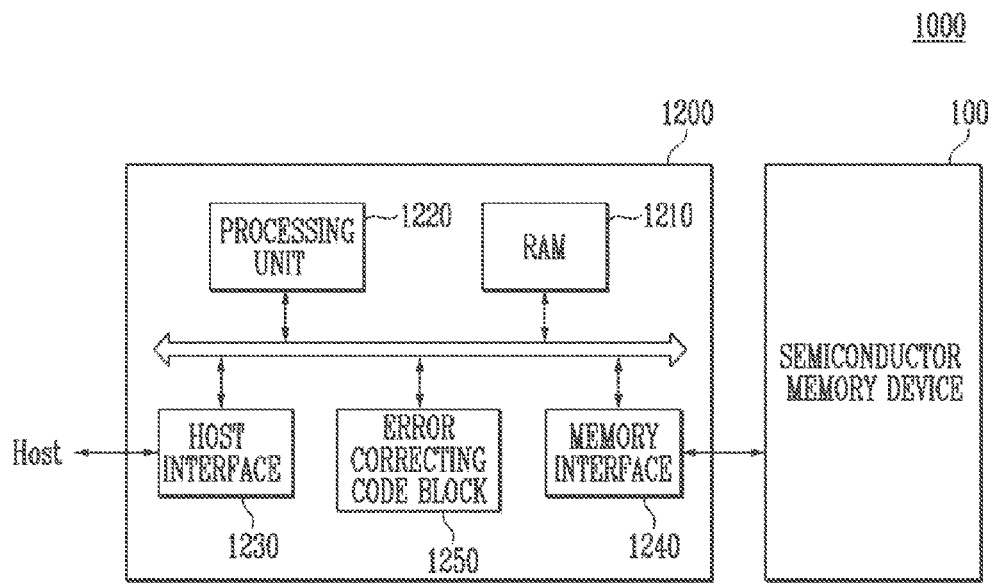
FIG. 10 is a block diagram illustrating a representation of a memory system including the semiconductor memory device illustrated in FIG. 1.

FIG. 10 is a block diagram illustrating a representation of a memory system 1000 including the semiconductor memory device 100 illustrated in FIG. 1.

Referring to FIG. 10, the memory system 1000 may include the semiconductor memory device 100 and a controller 1200.

The semiconductor memory device 100 may be configured and operated in substantially the same manner as the described above with reference to FIG. 1. Thus, a detailed description thereof will be omitted.

The controller 1200 may be coupled to a host and the semiconductor memory device 100. The controller 1200 may access the semiconductor memory device 100 in response to a request from the host. For example, the memory controller 1200 may control read, write, erase and background operations of the semiconductor memory device 100. The controller 1200 may provide an interface between the semiconductor memory device 100 and the host. The controller 1200 may drive firmware for controlling the semiconductor memory device 100.

The controller 1200 may include random access memory (RAM) 1210, a processing unit 1220, a host interface 1230, a memory interface 1240 and an error correcting code block 1250.

The RAM 1210 may function as at least one of the operation memories of the processing unit 1220, a cache memory between the semiconductor memory device 100 and the host, and a buffer memory between the semiconductor memory device 100 and the host.

The processing unit 1220 may control the general operation of the controller 1200.

The host interface 1230 may include a protocol for data exchange between the host and the controller 1200. According to an example of an embodiment, the controller 1200 may communicate with the host through one of various interface protocols including a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol and a private protocol.

The memory interface 1240 may include a protocol for communication with the semiconductor memory device 100. For example, the memory interface 1240 may include at least one flash interface, such as a NAND interface and a NOR interface.

The ECC block 1250 may detect an error in data from the semiconductor memory device 100 by using an error correcting code (ECC).

The controller 1200 and the semiconductor memory device 100 may be integrated into a single semiconductor device. In an example of an embodiment, the controller 1200 and the semiconductor memory device 100 may be integrated into a single semiconductor device to form a memory card. For example, the controller 1200 and the semiconductor memory device 100 may be integrated into a single semiconductor device to form a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage card (UFS).

The controller 1200 and the semiconductor memory device 100 may be integrated into a single semiconductor device to form a semiconductor drive (Solid State Drive (SSD)). The semiconductor drive (SSD) may include a storage device configured to store data in a semiconductor memory. When the memory system 1000 is used as the semiconductor drive (SSD), the operating speed of the host coupled to the memory system 1000 may be significantly improved.

In an example, the memory system 1000 may be used as one of various components of an electronic device, such as a computer, an ultra mobile PC (UMPC), a workstation, a netbook, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home networks, one of various electronic devices for computer networks, one of various electronic devices for telematics networks, an RFID device and/or one of various devices for computing systems, etc.

In an example of an embodiment, the semiconductor memory device 100 or the memory system 1000 may be packaged in a variety of ways. For example, in some embodiments, the semiconductor memory device 100 or the memory system 1000 may be packaged using various methods such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi chip package (MCP), a wafer-level fabricated package (WFP) and/or a wafer-level processed stack package (WSP), etc.

Figure 11:
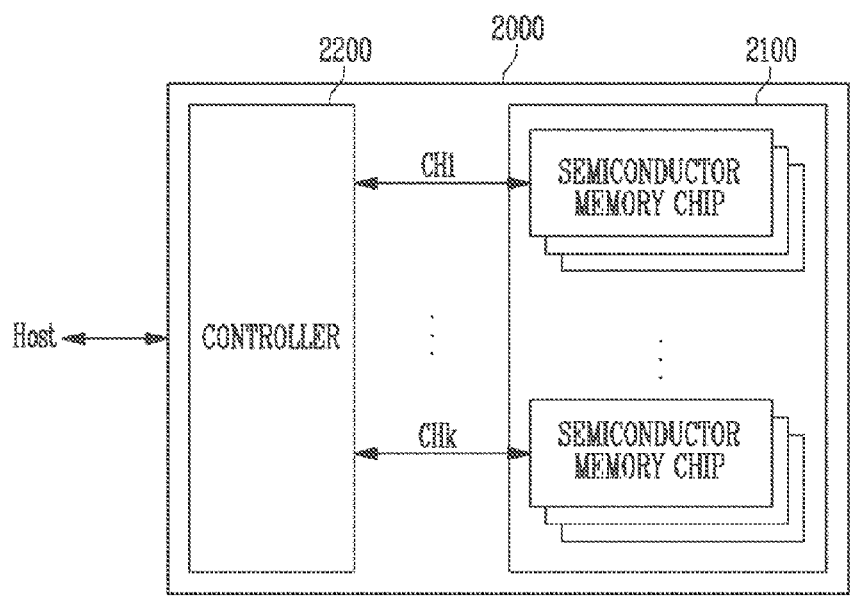
FIG. 11 is a block diagram illustrating a representation of an application example of the memory system illustrated in FIG. 10.

FIG. 11 is a block diagram illustrating a representation of an application example 2000 of the memory system 1000 illustrated in FIG. 10.

Referring to FIG. 11, a memory system 2000 may include a semiconductor memory device 2100 and a controller 2200. The semiconductor memory device 2100 may include a plurality of semiconductor memory chips. The semiconductor memory chips may be divided into a plurality of groups.

FIG. 11 illustrates the plurality of groups communicating with the controller 2200 through first to k-th channels CH1 to CHk, respectively. Each of the memory chips may be configured and operated in substantially the same manner as the semiconductor memory device 100 described above with reference to FIG. 1.

Each of the groups may communicate with the controller 2200 through a single common channel. The controller 2200 may be configured in substantially the same manner as the controller 1200 described above with reference to FIG. 10 and may control the plurality of memory chips of the semiconductor memory device 2100.

FIG. 11 illustrates the plurality of semiconductor memory chips coupled to a single channel. However, the memory system 2000 may be modified so that a single semiconductor memory chip may be coupled to a single channel.

Figure 12:
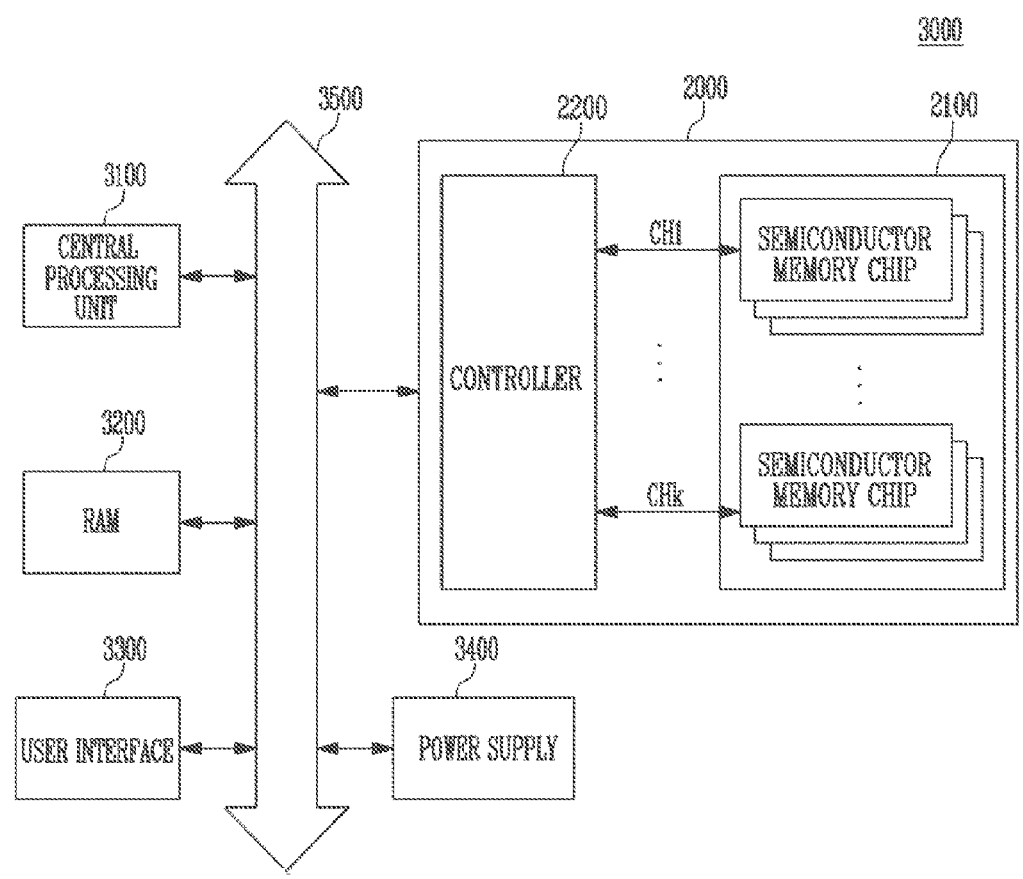
FIG. 12 is a block diagram illustrating a representation of a computing system including the memory system described with reference to FIG. 11.

FIG. 12 is a block diagram illustrating a representation of a computing system 3000 including the memory system 2000 described with reference to FIG. 11.

Referring to FIG. 12, the computing system 3000 may include a central processing unit 3100, random access memory (RAM) 3200, a user interface 3300, a power supply 3400, a system bus 3500, and the memory system 2000.

The memory system 2000 may be electrically coupled to the central processing unit 3100, the RAM 3200, the user interface 3300 and the power supply 3400 through the system bus 3500. Data provided through the user interface 3300 or processed by the central processing unit 3100 may be stored in the memory system 2000.

FIG. 12 illustrates the semiconductor memory device 2100 coupled to the system bus 3500 through the controller 2200. However, the semiconductor memory device 2100 may be directly coupled to the system bus 3500. Functions of the controller 2200 may be performed by the central processing unit 3100 and the RAM 3200.

FIG. 12 illustrates the memory system 2000 described above with reference to FIG. 11. However, the memory system 2000 may be replaced by the memory system 1000 described above with reference to FIG. 10. According to an embodiment, the computing system 3000 may include both memory systems 1000 and 2000 described above with reference to FIGS. 10 and 11, respectively.

According to the embodiments, a semiconductor memory device having improved reliability may be provided.

What is claimed is:

1. A semiconductor memory device including normal memory cells stacked over a substrate, the semiconductor memory device comprising:
    source selection transistors coupled to a common source line;
    source side dummy memory cells coupled between the source selection transistors and the normal memory cells;
    drain selection transistors coupled to a bit line; and
    drain side dummy memory cells coupled between the drain selection transistors and the normal memory cells,
    wherein a number of the source side dummy memory cells is less than a number of the drain side dummy memory cells, and
    wherein a number of the drain selection transistors is greater than a number of the source selection transistors.

2. The semiconductor memory device of claim 1, wherein the number of the drain selection transistors is greater than the number of the source selection transistors by a difference between the number of the drain side dummy memory cells and the number of the source side dummy memory cells.

3. The semiconductor memory device of claim 1, wherein the drain selection transistors include first drain selection transistors and second drain selection transistors coupled in series with each other,
    the first drain selection transistors are coupled in common to a first drain selection line, and
    the second drain selection transistors are coupled in common to a second drain selection line.

4. The semiconductor memory device of claim 1, wherein the source selection transistors are coupled in common to a single source selection line.

5. The semiconductor memory device of claim 1, further comprising a pipe transistor,
    wherein the source selection transistors, the source side dummy memory cells and first normal memory cells, among the normal memory cells, form a first sub-cell string,
    second normal memory cells, among the normal memory cells, the drain side dummy memory cells and the drain selection transistors form a second sub-cell string, and
    the first and second sub-cell strings are coupled through the pipe transistor.

6. The semiconductor memory device of claim 5, wherein a height of the first sub-cell string from the pipe transistor is substantially equal to a height of the second sub-cell string from the pipe transistor.

7. The semiconductor memory device of claim 6, wherein a number of the first normal memory cells is greater than a number of the second normal memory cells.

8. The semiconductor memory device of claim 5, wherein the first normal memory cells, the source side dummy memory cells and the source selection transistors are sequentially stacked in a direction crossing the substrate, and
    the second normal memory cells, the drain side dummy memory cells and the drain selection transistors are sequentially stacked in the direction crossing the substrate.

9. The semiconductor memory device of claim 1, wherein the source selection transistors, the source side dummy memory cells, the normal memory cells, the drain side dummy memory cells and the drain selection transistors are sequentially stacked in a direction crossing the substrate.

10. A semiconductor memory device, comprising:
    a pipe transistor;
    a first sub-cell string extending between the pipe transistor and a common source line and including source selection transistors coupled to the common source line and source side dummy memory cells coupled to the source selection transistors; and
    a second sub-cell string extending between the pipe transistor and a bit line and including drain selection transistors coupled to the bit line and drain side dummy memory cells coupled to the drain selection transistors,
    wherein a number of the source side dummy memory cells is less than a number of the drain side dummy memory cells, and a number of the drain selection transistors is greater than a number of the source selection transistors.

11. The semiconductor memory device of claim 10, wherein the number of the drain selection transistors is greater than the number of the source selection transistors by a difference between the number of the drain side dummy memory cells and the number of the source side dummy memory cells.

12. The semiconductor memory device of claim 10, wherein a height of the first sub-cell string from the pipe transistor is substantially equal to a height of the second sub-cell string from the pipe transistor.

13. The semiconductor memory device of claim 10, wherein the first sub-cell string includes first normal memory cells coupled in series between the source side dummy memory cells and the pipe transistor, and the second sub-cell string includes second normal memory cells coupled in series between the drain side dummy memory cells and the pipe transistor.

14. The semiconductor memory device of claim 13, wherein a number of the first normal memory cells is greater than a number of the second normal memory cells.

15. The semiconductor memory device of claim 14, wherein the number of the first normal memory cells is greater than the number of the second normal memory cells by a sum of a difference between the number of the source side dummy memory cells and the number of the drain side dummy memory cells and a difference between the number of the source selection transistors and the number of the drain selection transistors.

16. The semiconductor memory device of claim 10, wherein the drain selection transistors include first drain selection transistors and second drain selection transistors coupled in series with each other, the first drain selection transistors are coupled in common to a first drain selection line, and the second drain selection transistors are coupled in common to a second drain selection line.

17. The semiconductor memory device of claim 10, wherein the source selection transistors are coupled in common to a single source selection line.

18. A semiconductor memory device including:
a first sub-cell string stacked over a substrate and including a first set of normal memory cells;
a second sub-cell string stacked over the substrate and including a second set of normal memory cells;
drain selection transistors coupled to the second set of normal memory cells; and
source selection transistors coupled to the first set of normal memory cells,
wherein the first and second sub-cell strings are configured to reduce leakage current of the normal memory cells by including greater numbers of the drain selection transistors in the second sub-cell string than the source selection transistors in the first sub-cell string.

19. The semiconductor memory device of claim 18, wherein a height of the first sub-cell string from the substrate is substantially equal to a height of the second sub-cell string from the substrate.

20. The semiconductor memory device of claim 18, further comprising:
source side dummy memory cells coupled between the source selection transistors and the first set of normal memory cells; and
drain side dummy memory cells coupled between the drain selection transistors and the second set of normal memory cells,
wherein a number of the source side dummy memory cells is less than a number of the drain side dummy memory cells.

* * * * *